US009767994B2

(12) United States Patent
Okesaku et al.

(10) Patent No.: US 9,767,994 B2
(45) Date of Patent: *Sep. 19, 2017

(54) SHOWER PLATE SINTERED INTEGRALLY WITH GAS RELEASE HOLE MEMBER AND METHOD FOR MANUFACTURING THE SAME

(71) Applicants: TOKYO ELECTRON LIMITED, Tokyo (JP); NATIONAL UNIVERSITY CORPORATION TOHOKU UNIVERSITY, Sendai-shi (JP)

(72) Inventors: Masahiro Okesaku, Komatsu (JP); Tadahiro Ohmi, Sendai (JP); Tetsuya Goto, Sendai (JP); Takaaki Matsuoka, Tokyo (JP); Toshihisa Nozawa, Kurokawa-gun (JP); Atsutoshi Inokuchi, Kurokawa-gun (JP); Kiyotaka Ishibashi, Kurokawa-gun (JP)

(73) Assignees: TOKYO ELECTRON LIMITED, Tokyo (JP); NATIONAL UNIVERSITY CORPORATION TOHOKU UNIVERSITY, Sendai-Shi (JP)

( * ) Notice: Subject to any disclaimer, the term of this patent is extended or adjusted under 35 U.S.C. 154(b) by 284 days.

This patent is subject to a terminal disclaimer.

(21) Appl. No.: 14/542,793

(22) Filed: Nov. 17, 2014

(65) Prior Publication Data

US 2015/0069674 A1    Mar. 12, 2015

Related U.S. Application Data

(62) Division of application No. 12/446,913, filed as application No. PCT/JP2007/068613 on Sep. 26, 2007, now Pat. No. 8,915,999.

(30) Foreign Application Priority Data

Oct. 23, 2006    (JP) ................................. 2006-287934

(51) Int. Cl.
*H01J 37/32* (2006.01)
*C23C 16/455* (2006.01)

(52) U.S. Cl.
CPC .... *H01J 37/3244* (2013.01); *C23C 16/45565* (2013.01); *C23C 16/45568* (2013.01);
(Continued)

(58) Field of Classification Search
CPC ........ C23C 16/45568; C23C 16/45565; H01L 21/3065; H01J 37/026; H01J 37/3244;
(Continued)

(56) References Cited

U.S. PATENT DOCUMENTS 4,508,054 A    4/1985 Baumberger et al.
5,439,524 A    8/1995 Cain et al.
(Continued)

FOREIGN PATENT DOCUMENTS

JP    09063793    3/1997
JP    2000252270    9/2000
(Continued)

OTHER PUBLICATIONS

Translation of JP 2002-343788.*
(Continued)

*Primary Examiner* — Jeffrie R Lund
(74) *Attorney, Agent, or Firm* — Cantor Colburn LLP

(57) ABSTRACT

A shower plate is disposed in a processing chamber in a plasma processing apparatus, and plasma excitation gas is released into the processing chamber so as to generate plasma. A ceramic member having a plurality of gas release holes having a diameter of 20 μm to 70 μm, and/or a porous
(Continued)

gas-communicating body having pores having a maximum diameter of not more than 75 μm communicating in the gas-communicating direction are sintered and bonded integrally with the inside of each of a plurality of vertical holes which act as release paths for the plasma excitation gas.

10 Claims, 7 Drawing Sheets

(52) U.S. Cl.
CPC .... *H01J 37/3255* (2013.01); *H01J 37/32192* (2013.01); *H01J 37/32449* (2013.01); *H01J 37/32477* (2013.01)

(58) Field of Classification Search
CPC ............. H01J 37/3255; H01J 37/32449; H01J 37/32192; H01J 37/32477
USPC ......... 118/723 E, 723 R; 156/345.47, 345.43
See application file for complete search history.

(56) References Cited

U.S. PATENT DOCUMENTS

| | | | |
|---|---|---|---|
| 5,962,085 | A | 10/1999 | Hayashi et al. |
| 5,996,528 | A | 12/1999 | Berrian et al. |
| 6,660,572 | B2 | 12/2003 | Miyasaka |
| 6,793,733 | B2 | 9/2004 | Janakiraman et al. |
| 7,115,184 | B2 | 10/2006 | Ohmi et al. |
| 7,802,539 | B2 | 9/2010 | Bosch |
| 8,038,834 | B2 | 10/2011 | Funk et al. |
| 8,074,599 | B2 | 12/2011 | Choi et al. |
| 8,083,891 | B2 | 12/2011 | Sato |
| 8,372,200 | B2 | 2/2013 | Okesaku et al. |
| 8,915,999 | B2 * | 12/2014 | Okesaku ............ C23C 16/45565 118/715 |
| 8,925,351 | B2 * | 1/2015 | Tian .................. H01J 37/32192 156/345.33 |
| 2001/0006070 | A1 | 7/2001 | Shang et al. |
| 2002/0011215 | A1 | 1/2002 | Tei et al. |
| 2003/0037880 | A1 | 2/2003 | Carducci et al. |
| 2003/0041801 | A1 | 3/2003 | Hehmann |
| 2003/0089314 | A1 | 5/2003 | Matsuki et al. |
| 2003/0178144 | A1 | 9/2003 | Ohmi et al. |
| 2004/0221809 | A1 | 11/2004 | Ohmi et al. |
| 2004/0261712 | A1 | 12/2004 | Hayashi et al. |
| 2005/0081788 | A1 | 4/2005 | Jurgensen et al. |
| 2005/0082385 | A1 | 4/2005 | Kuwada et al. |
| 2005/0092437 | A1 | 5/2005 | Ohmi et al. |
| 2005/0109460 | A1 | 5/2005 | Dedontney et al. |
| 2005/0183666 | A1 | 8/2005 | Tsuji et al. |
| 2006/0073354 | A1 * | 4/2006 | Watanabe ............... C22C 21/00 428/596 |
| 2007/0068625 | A1 | 3/2007 | Funk et al. |
| 2008/0206463 | A1 | 8/2008 | Grigorian et al. |
| 2008/0254220 | A1 * | 10/2008 | Tian .................. H01J 37/32192 427/271 |
| 2009/0000742 | A1 | 1/2009 | Okesaku et al. |
| 2009/0205782 | A1 | 8/2009 | Ohmi et al. |
| 2009/0226614 | A1 | 9/2009 | Nasman |
| 2009/0229753 | A1 | 9/2009 | Ohmi et al. |
| 2009/0229755 | A1 | 9/2009 | Ohmi et al. |
| 2009/0255631 | A1 | 10/2009 | Sato |
| 2009/0286405 | A1 | 11/2009 | Okesaku et al. |
| 2009/0291563 | A1 | 11/2009 | Ishibashi |
| 2009/0311869 | A1 | 12/2009 | Okesaku et al. |
| 2010/0025821 | A1 | 2/2010 | Ohmi et al. |
| 2010/0178775 | A1 | 7/2010 | Okesaku et al. |
| 2010/0230387 | A1 | 9/2010 | Okesaku et al. |
| 2010/0288439 | A1 | 11/2010 | Ishibashi et al. |
| 2011/0030898 | A1 | 2/2011 | Sato |
| 2013/0112337 | A1 * | 5/2013 | Okesaku ............ C23C 16/45565 156/89.11 |
| 2013/0292047 | A1 * | 11/2013 | Tian .................. H01J 37/32192 156/242 |
| 2015/0069674 | A1 * | 3/2015 | Okesaku ............ C23C 16/45565 264/629 |

FOREIGN PATENT DOCUMENTS

| | | |
|---|---|---|
| JP | 2002343788 | 11/2002 |
| JP | 2004039972 | 2/2004 |
| JP | 2005033167 | 2/2005 |
| JP | 2008047869 | 2/2008 |
| JP | 2008047883 | 2/2008 |
| WO | 2006112392 | 10/2006 |

OTHER PUBLICATIONS

International Search Report—PCT/JP2007/068613 dated Nov. 20, 2007.

Taiwanese Office Action—Taiwanese Application No. 096138534 issued on Feb. 21, 2012, citing U.S. Pat. No. 7,115,184, US20050183666, and US20030178144.

* cited by examiner

SHOWER PLATE SINTERED INTEGRALLY WITH GAS RELEASE HOLE MEMBER AND METHOD FOR MANUFACTURING THE SAME

CROSS-REFERENCE TO RELATED PATENT APPLICATIONS

This application is a divisional application of U.S. application Ser. No. 12/446,913, filed on Jan. 25, 2010, which claims a priority to and the benefit of Japanese Patent Application No. 2006-287934, filed on Oct. 23, 2006, the disclosures of which are incorporated herein in its entirety by reference.

TECHNICAL FIELD

The present invention relates to a plasma processing apparatus, and more particularly, to a shower plate used for a microwave plasma processing apparatus and a method of manufacturing the shower plate, a plasma processing apparatus using the shower plate, a plasma processing method, and a method of manufacturing an electronic apparatus.

BACKGROUND ART

Plasma processing and plasma processing apparatuses have become indispensable in the manufacturing of ultrafine semiconductor devices which are called recently deep submicron devices or deep sub-quarter micron devices, having a gate length of 0.1 µm or less, or in the manufacturing of high resolution flat panel display devices including liquid crystal display devices.

Various plasma exciting methods are conventionally used for plasma processing apparatuses used to manufacture semiconductor devices or liquid crystal display devices. In particular, parallel-plate type high frequency excitation plasma processing apparatuses or induction-coupled type plasma processing apparatuses are generally used as plasma processing apparatuses. However, these conventional plasma processing apparatuses have a drawback in that since the formation of plasma is not uniform and regions of high electron density are limited, it is difficult for conventional plasma processing apparatuses to achieve uniform processing over the entire surface of a substrate to be processed at a high processing speed, that is, at a high throughput. This problem becomes particularly serious when a substrate having a large diameter is processed. Further, these conventional plasma processing apparatuses suffer from some inherent problems, such as damage to the semiconductor devices formed on the substrate to be processed due to their high electron temperature, and, severe metal contamination caused by sputtering of a processing chamber wall. Thus, it is becoming more difficult for conventional plasma processing apparatuses to satisfy the constant demand for further miniaturization of semiconductor devices or liquid crystal display devices and further improvement in productivity.

To solve this difficulty, a conventional microwave plasma processing apparatus that uses high-density plasma excited by a microwave electric field without using a direct current magnetic field has been proposed. For example, a plasma processing apparatus, having a construction in which microwaves are radiated to a processing chamber from a planar antenna (radial-line slot antenna) having a number of slots arranged to radiate uniform microwaves, the gas inside the processing chamber is ionized by the microwave electric field to generate plasma, has been proposed (for example, refer to Japanese Laid-Open Patent Publication No. Hei 9-63793 (hereinafter, referred to as Reference 1)). In the plasma excited by the microwave electric field, it is possible to realize a high plasma density over a wide area below the planar antenna, and it is possible to conduct uniform plasma processing in a short time. Further, since the electron temperature is low in the plasma formed by the microwave electric field, it is possible to avoid damage being caused to or metal contamination of the substrate to be processed. Further, since it is possible to excite uniform plasma over a large area of a substrate, the above-mentioned technology can be easily applied to the manufacturing process of semiconductor devices by using semiconductor substrates having large diameters or manufacturing of large liquid crystal display devices.

Plasma processing apparatuses use a shower plate including a plurality of vertical holes as gas release holes in order to uniformly supply a gas for exciting plasma into a processing chamber. However, when using the shower plate, plasma formed right below the shower plate may flow backwards through the vertical holes of the shower plate, which causes an abnormal discharge or deposition of gases, and thus transmission efficiency of microwaves for plasma excitation or yield of devices deteriorates.

Many structures of the shower plate have been suggested to prevent the reverse flow of plasma through the vertical holes.

For example, in Japanese Laid-Open Patent Publication No. 2005-33167 (hereinafter, referred to as Reference 2), the hole diameter of a gas release hole formed in the leading end of a vertical hole of a shower plate is set to not greater than twice the sheath thickness of plasma formed right below the shower plate. However, it is insufficient to reduce the hole diameter of the gas release hole in order to prevent the reverse flow of plasma. In particular, if a plasma density is increased from $10^{12}$ cm$^{-3}$, which is a conventional value, to $10^{13}$ cm$^{-3}$ in order to reduce damage and increase a processing speed, it is impossible to prevent the reverse flow of plasma by only controlling the hole diameter of the gas release hole since the reverse flow of plasma increases. Also, it is difficult to form the gas release hole having a micro hole diameter by processing a hole of a shower plate body, and is problematic in terms of processability.

Japanese Laid-Open Patent Publication No. 2004-39972 (hereinafter, referred to as Reference 3) discloses the use of a shower plate that is a porous ceramic sintered body having gas permeability. The shower plate is for preventing the reverse flow of plasma by the walls of a plurality of pores included in the porous ceramic sintered body.

However, the shower plate having general porous ceramic sintered body sintered at a normal temperature and a pressure is not good in surface planarization since the shower plate includes pores having a large deviation between several µm and several tens of µm in terms of pore diameters, has a large maximum crystal diameter of 20 µm, and does not have a uniform structure. If a surface of the shower plate being exposed to plasma is the porous ceramic sintered body, an effective surface area increases, and electron and ion recombination of the plasma increases, which deteriorate power efficiency of excitation of plasma. In this regard, the Reference 3 discloses, instead of wholly forming the shower plate as the porous ceramic sintered body, forming a structure of the shower plate formed of dense alumina in which an opening for releasing gas is formed, and the general porous ceramic sintered body sintered at the normal temperature and pressure is fitted into the opening, and then gas is released through the porous ceramic sintered body. However, since the structure uses the porous ceramic sintered body sintered at the ordinary temperature and pressure, the above-mentioned problem caused by poor surface-planarization has not been solved.

Also, in International Publication WO06/112392 (hereinafter, referred to as Reference 4), the applicant of the present application has suggested preventing the reverse flow of plasma by not adjusting the structure of a shower plate but adjusting a diameter size of a gas release hole. In more detail, the diameter size of the gas release hole is set less than 0.1~0.3 mm, and a tolerance accuracy of the diameter size is set to within ±0.002 mm, and thus the reverse flow of plasma is prevented and no variation in the amount of released gas occurs.

However, when the shower plate has been actually used for a microwave plasma processing apparatus under plasma density conditions of $10^{-3}$ cm$^{-3}$, as shown in FIG. 10, a discolored light brown portion is seen as a result of the reverse flow of plasma into a space 402 for charging plasma excitation gas formed between a shower plate body 400 and a cover plate 401 and a vertical hole 403 in communication with the space 402.

To address the above-mentioned problems, in Japanese Patent Application Nos. 2006-163357, 2006-198762, and 2006-198754 (hereinafter, referred to as References 5 through 7, respectively), the applicant of the present application has suggested fitting a ceramic member having a plurality of gas release holes or a porous gas-communicating body having pores communicating in a gas-communicating direction into a vertical hole of a shower plate as a release path for plasma excitation gas.

In the References 5 through 7, the shower plate can prevent the reverse flow of plasma even under plasma density conditions of $10^{13}$ cm$^{-3}$.

However, since the shower plate has been repeatedly used for a microwave plasma processing apparatus, the ceramic member or the porous gas-communicating body fitted into the vertical hole of the shower plate partially or wholly comes out from the vertical hole of the shower plate. This is a result of a reduction in the adherence between the ceramic body or the porous gas-communicating body and the vertical hole of the shower plate, caused by thermal stress or thermal deformation that occurs when using the shower plate.

DISCLOSURE OF THE INVENTION

Technical Solution

To solve the above and/or other problems disclosed in the References 5 through 7, the present invention provides a shower plate for plasma reverse flow prevention purposes, comprising gas release hole members (a ceramic member or a porous gas-communicating body) sintered and bonded integrally without any space and disposed within vertical holes in the shower plate, so that the gas release hole members do not become detached from the vertical holes during use of the shower plate, and thus, there is no variation in the amount of gas released from each vertical hole, the reverse flow of plasma can be more completely prevented, and resulting in plasma excitation with high efficiency.

According to an aspect of the present invention, a ceramic member or a porous gas-communicating body is sintered and bonded with a vertical hole of a shower plate. A diameter of each of gas release holes of the ceramic member may be between 20 μm to 70 μm, an aspect ratio of lengths to hole diameters of the gas release holes of the ceramic member may be equal to or greater than 20, a maximum pore diameter of the porous gas-communicating body is equal to or less than 75 μm, and a pore diameter of a narrow path along a gas-communicating path may be equal to or less than 10 μm, thereby more completely preventing the reverse flow of plasma.

In more detail, the shower plate disposed in a plasma processing apparatus and releasing plasma excitation gas into the plasma processing apparatus so as to generate plasma, wherein the ceramic member having a plurality of gas release holes having the diameter of 20 μm to 70 μm and/or the porous gas-communicating body having pores having the maximum diameter of equal to or less than 75 μm, which communicate in a gas-communicating direction, may be formed in the inside of each of a plurality of vertical holes as release paths for plasma excitation gas, and the ceramic member and/or the porous gas-communicating body may be sintered and bonded integrally with the shower plate.

As described above, since the ceramic member or the porous gas-communicating body is sintered and integrally bonded without any space to be disposed within vertical holes in a shower plate as a gas-communicating path, the ceramic member or the porous gas-communicating body is secured into the vertical holes of the shower plate, so that the ceramic member or the porous gas-communicating body does not become detached from the vertical holes due to thermal stress or thermal deformation that occurs when using the shower plate, and there is no variation in the amount of gas released from each vertical hole. Also, the Diameter of each of gas release holes of the ceramic member is between 20 μm to 70 μm, the maximum pore diameter of the porous gas-communicating body is equal to or less than 75 μm, and the pore diameter of the narrow path along a gas-communicating path is equal to or less than 10 μm, thereby more completely preventing the reverse flow of plasma.

The ceramic member and the porous gas-communicating body used in the present invention may be formed of a low dielectric loss ceramic material having a dielectric loss in the range of $5 \times 10^{-3}$ and $1 \times 10^{-5}$. For example, a high purity alumina ceramic material, a small amount of an particle growth inhibition agent, an alumina ceramic material mixed with $Y_2O_3$ and mullite, a material formed of $Al_2O_3$ and $Y_2O_3$, or a material containing a garnet component that is a compound of $Al_2O_3$ and $Y_2O_3$, and further a ceramic material such as AlN, $SiO_2$, mullite, $Si_3N_4$, or SiAlON, can be used.

The aspect ratio of lengths to hole diameters of the gas release holes of the ceramic member may be equal to or greater than 20. FIG. 9 is a view for explaining the relationship between the aspect ratio of gas release holes and the reverse flow of plasma. If the pressure of a processing chamber of the plasma processing apparatus is reduced, the mean free path increases, resulting in an increase of a distance of electrons forming plasma which linearly move forward. As such, if electrons linearly move forward, a plasma introducible angle θ shown in FIG. 9 is defined by the aspect ratio of the gas release holes A as it is. That is, if the aspect ratio of the gas release holes A increases, the plasma introducible angle θ is reduced, thereby preventing the reverse flow of the plasma. Since the aspect ratio of the gas release holes A is equal to or greater than 20, even if plasma density is increased to $10^{13}$ cm$^{-3}$, it is possible to dramatically stop the reverse flow of the plasma.

The gas-communicating path formed by the pores of the porous gas-communicating body having the maximum pore diameter equal to or less than 75 μm in communication may have the narrow path having the pore diameter of equal to or less than 10 μm. Since the narrow path having the pore diameter is equal to or less than 10 μm, even if plasma density is increased to $10^{13}$ cm$^{-3}$, it is possible to dramatically stop the reverse flow of the plasma. In more detail, although the communication of gas of the porous gas-communicating body is secured via the communicating pores, the gas-communicating path is bent in zigzag shape, and further has the narrow path equal to or less than 10 μm. In this regard, since electrons or ions forming plasma tend to go straight, even though the plasma flows backwards to the porous gas-communicating body, most of the plasma collide with walls of the pores, and furthermore the plasma wholly collide in the narrow path having the pore diameter of equal to or less than 10 μm, thereby preventing the reverse flow of the plasma.

As the ceramic member or the porous gas-communicating body is sintered and integrally bonded within vertical holes in the shower plate as described above, the shower plate may be manufactured by fitting the ceramic member or the porous gas-communicating body into the vertical holes in the shower plate and then simultaneously sintering the shower plate and the ceramic member or the porous gas-communicating body fitted into the vertical holes of the shower plate. To be more specific, with regard to the ceramic member and the porous gas-communicating body, in the step of a powder molding body processed in a predetermined shape by molding material powder of the ceramic member and the porous gas-communicating body, a debinded body of the powder molding body, a pre-sintered body of the powder molding body, or a sintered body of the powder molding body, and with regard to the shower plate, in the step of a green body by molding material powder of the shower plate and by processing the vertical holes, a debinded body of the green body, a pre-sintered body of the green body, or a sintered body of the green body, the ceramic member and the porous gas-communicating body are fitted into at least the leading ends of the vertical holes in the shower plate, and are then simultaneously sintered. In this case, molding conditions or debinding, pre-sintering, and sintering conditions are adjusted in such a manner that the inner diameters of the vertical holes of the shower plate are almost the same as or slightly less than the outer diameters of elements fitted into the vertical holes after the simultaneous sintering is performed. As such, the ceramic member and the porous gas-communicating body are fitted into the vertical holes of the shower plate before the shower plate is sintered, and then are simultaneously sintered, thereby achieving a strong and secure fit of the ceramic member and the porous gas-communicating body into the vertical holes of the shower plate without any space.

Plasma excitation gas may be supplied to a plasma processing apparatus by using the shower plate of the present invention, plasma may be generated by exciting the supplied plasma excitation gas by microwaves, and oxidizing, nitriding, oxynitriding, chemical vapor deposition (CVD), etching, or irradiating plasma may be performed with regard to a substrate by using the plasma.

Effects of the Invention

According to the present invention, since a ceramic member or a porous gas-communicating body disposed within vertical holes in a shower plate is sintered and integrally bonded without any space for plasma reverse flow prevention purposes, there is no variation in the amount of gas released from each vertical hole and the ceramic member or the porous gas-communicating body does not become detached from the vertical holes during use of the shower plate and the reverse flow of plasma can be more completely prevented in the vertical holes which act as a release path for plasma excitation gas of the shower plate. An abnormal discharge or deposition of gas in the shower plate can be prevented, thereby preventing deterioration of transmission efficiency of microwaves for plasma excitation of deterioration of yield.

BRIEF DESCRIPTION OF THE DRAWINGS

The above and other features and advantages of the present invention will become more apparent by describing in detail exemplary embodiments thereof with reference to the attached drawings in which.

BEST MODE FOR CARRYING OUT THE INVENTION

Figure 1:
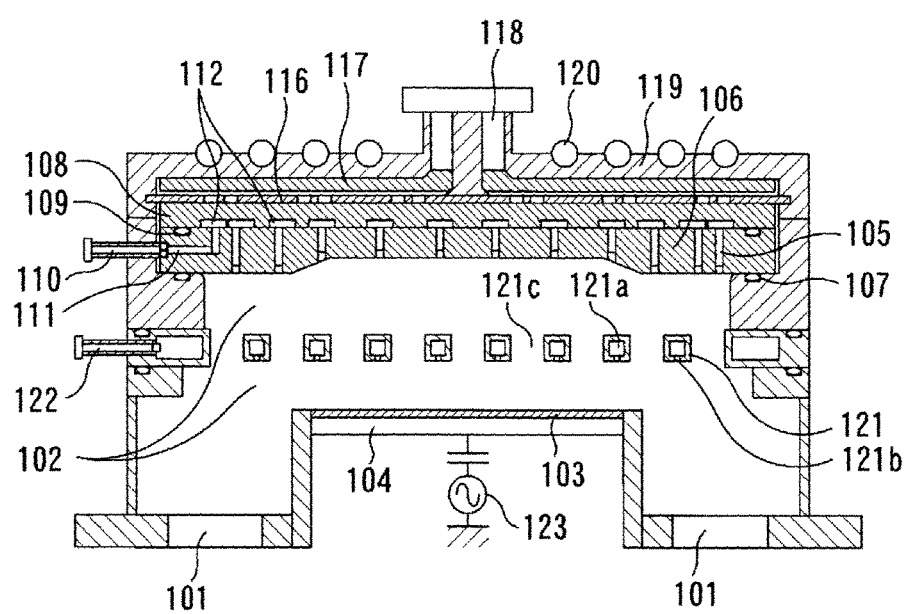
FIG. 1 is a cross-sectional view of a microwave plasma processing apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

[Embodiment 1]

FIG. 1 is a cross-sectional view of a microwave plasma processing apparatus according to an embodiment of the present invention. Referring to FIG. 1, the microwave plasma processing apparatus includes a processing chamber 102 from which gas is exhausted through a plurality of gas exhaust ports 101. A holding stage 104 for holding a substrate 103 to be processed is disposed in the processing chamber 102. In order to uniformly exhaust gas from the processing chamber 102, a ring shaped space is defined around the holding stage 104 of the processing chamber 102. The plurality of gas exhaust ports 101 are arranged at equal distances so as to communicate with each other in a ring shaped space, i.e., arranged in an axially symmetrical manner with respect to the substrate 103 to be processed. Gas from the processing chamber 102 can be uniformly exhausted through the gas exhaust ports 101 according to the arrangement of the gas exhaust ports 101.

A shower plate 106 is attached to an upper portion of the processing chamber 102 through a sealing O-ring 107 at a position corresponding to the substrate 103 to be processed on the holding stage 104, as a part of the outer walls of the processing chamber 102. The shower plate 106 is formed of dielectric alumina having a diameter of 408 mm, a relative permittivity of 9.8, and a low microwave dielectric loss (equal to or less than $1 \times 10^{-4}$), and is in the form of a plate in which a plurality (230) of openings, i.e. vertical holes 105, are formed. Also, a cover plate 108 formed of alumina is attached to the processing chamber 102 through a sealing O-ring 109 on an upper surface side of the shower plate 106, i.e., on an opposite side to the holding stage 104 with respect to the shower plate 106.

Figure 2:
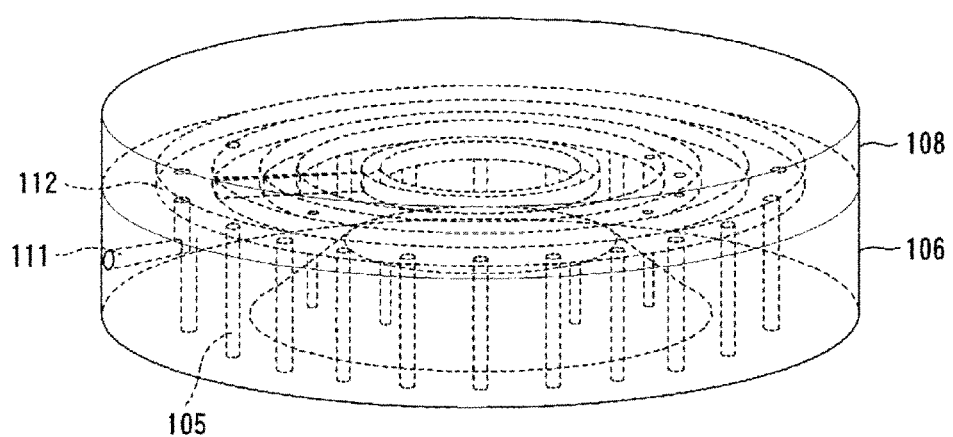
FIG. 2 is a schematic perspective view of horizontal holes and vertical holes of a shower plate shown in FIG. 1.

FIG. 2 is a schematic perspective view of the arrangement of the shower plate 106 and the cover plate 108. Referring to FIGS. 1 and 2, a plurality of spaces 112 for charging plasma excitation gas supplied from a plasma excitation gas inlet port 110 through a gas supply hole 111 which are open and communicate with the inside of the shower plate 106, are disposed between the upper surface of the shower plate 106 and the cover plate 108. In other words, grooves are formed in the lower surface of the cover plate 108 in the shower plate 106 side so that vertical holes 105 and a position corresponding to the gas supply hole 111 communicate each other to form the spaces 112 between the shower plate 106 and the cover plate 108. That is, the vertical holes 105 are disposed to communicate with the spaces 112.

Figure 3:
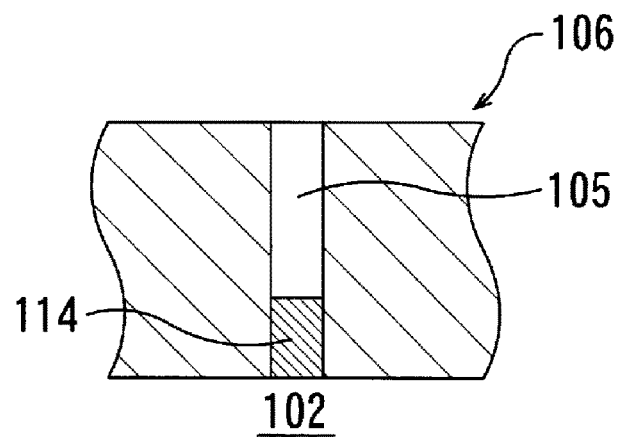
FIG. 3 is a detailed cross-sectional view of a vertical hole of the shower plate shown in FIG. 1.

FIG. 3 is a detailed cross-sectional view of the vertical hole 105. The length of the vertical hole 105 is about 8~21 mm, and the diameter thereof is equal to or less than 3 mm (preferably equal to or less than 1 mm). A porous ceramic sintered body 114, which has a cylindrical shape having a height of about 2~6 mm and has pores that communicate in a gas-communicating direction, is sintered and bonded with the leading end of the vertical holes 105. The porous ceramic sintered body 114 is formed of an alumina-based material. A gas-communicating path formed by the communicated pores has a narrow pore diameter of equal to or less than 10 μm, a dielectric loss in the range of $5 \times 10^{-3}$ and $1 \times 10^{-5}$, an average crystal diameter of equal to or less than 10 μm, a porosity between 20~75%, an average pore diameter of equal to or less than 10 μm, a maximum porosity equal to or less than 75 μm, and a bending strength being equal to or more than 30 MPa.

Examples of manufacturing the shower plate 106 sintered and bonded with the porous ceramic sintered body 114 will now be described below.

(Manufacturing Example 1)

A green body for a shower plate, which is molded according to predetermined dimensions of outer diameter, thickness, horizontal holes, and vertical holes, is prepared after press-molding sprayed granulated powder having an average particle diameter of 70 μm, which is obtained by mixing $Al_2O_3$ powder having an average powder particle diameter of 0.6 μm and a purity of 99.99% with 3 mass % wax at various pressures of 78~147 MPa.

Meanwhile, with regard to a porous ceramic sintered body, a green body is obtained by adding the 3 mass % wax to the $Al_2O_3$ powder for the shower plate and press-molding the mixture of the $Al_2O_3$ powder with the 3 mass % wax after obtaining pre-sintered powder by baking the sprayed granulated powder at 800° C. A powder molding body obtained by processing the green body in a predetermined shape, a debinded body obtained by sintering the powder molding body at 450° C., a pre-sintered body obtained by sintering the powder molding body at 1000° C., and a sintered body obtained by sintering the powder molding body at 1450° C. are prepared.

Also, the green body for the shower plate has different sintering contraction rates due to press-molding pressures. In addition, the sintering contraction rate is 19% at 78 MPa and 16.2% at 147 MPa. A material for the porous ceramic sintered body has different sintering contraction rates depending on the porosity or pore diameter and also due to press-molding pressures. Thus, the dimension of the porous ceramic sintered body is measured after the sintering contraction occurs by previously examining the sintering contraction rate whenever the properties of the porous ceramic sintered body are set.

By calculating the inner diameter of a sintered vertical hole using the sintering contraction rate of the shower plate green body, a powder molding body, a debinded body, a pre-sintered body, or a sintered body of the porous ceramic sintered body having an outer diameter equal to and greater than the inner diameter of the sintered vertical hole by a maximum outer diameter of 50 μm, is fitted into the vertical hole and is simultaneously sintered. Therefore, a strong and secure fit is achieved due to the sintering coupling force between the vertical hole and the body fitted into the vertical hole.

A gas-communicating path formed, after the simultaneous sintering is performed, by pores of the porous ceramic sintered body, in communication with each other, has a narrow pore diameter of 2 μm, a dielectric loss of $2.5 \times 10^{-4}$, an average crystal diameter of 1.5 μm, a maximum crystal diameter of 3 μm, a porosity of 40%, an average pore diameter of 3 μm, a maximum pore diameter of 5 μm, and a bending degree of 300 MPa.

(Manufacturing Example 2)

A debinded body is obtained by baking the same green body for the shower plate as described in the manufacturing example 1, at 450° C. The sintering contraction rate of the debinded body is the same as that of the green body.

A pre-sintered body is obtained by baking (pre-sintering) the green body for the shower plate at 600° C.~1000° C. Since a slight sintering contraction occurs in the pre-sintering operation, the higher the pre-sintering temperature is, the less the sintering contraction rate of the remains when the pre-sintered body is sintered.

Meanwhile, since the porous ceramic pre-sintering body material obtained by using the same method as described in the manufacturing example 1 uses powder particles obtained by pre-sintering the sprayed granulated powder and the porous ceramic pre-sintering body material has a sintering contraction rate slightly less than the green body for the shower plate, the outer diameter dimension of the vertical hole of the green body for the shower plate can be designed by measuring the outer diameter dimension with regard to the same temperature as the sintering temperature of the shower plate or by calculating the outer diameter dimension using the contraction rate of the shower plate.

In the same manner as described in the manufacturing example 1, a shower plate material and the porous ceramic sintering body material fitted into the vertical hole are simultaneously sintered, thereby producing the sintering coupling force between the shower plate and the porous ceramic sintered body, so that a strong and secure fit is achieved.

In this regard, the thickness d of a plasma sheath thickness formed on the surface of an object contacting plasma is expressed according to equation 1 below, $$d = 0.606 \lambda_D \left(\frac{2V_0}{T_e}\right)^{3/4} \quad 1)$$

wherein $V_0$ denotes an electric potential difference (in units of V) between the plasma and the object, Te denotes an electron temperature (in units of eV), and $\lambda_D$ denotes a Debye length expressed according to equation 2 below, $$\lambda_D = \sqrt{\frac{\varepsilon_0 k T_e}{n_e e^2}} \quad 2)$$

$$= 7.43 \times 10^3 \sqrt{\frac{T_e[eV]}{n_e[m^{-3}]}} \; [m]$$

wherein $\varepsilon_0$ denotes vacuum magnetic permeability, k denotes a Boltzmann constant, and $n_e$ denotes electron density of plasma.

Referring to Table 1, as the electron density of plasma increases and the Debye length becomes small, a hole diameter of the porous ceramic sintered body 114 may be preferably smaller, so as to prevent the reverse flow of the plasma. In more detail, the size of the average pore diameter may be equal to or less than twice the thickness of the plasma sheath, and preferably equal to or less than the thickness of the plasma sheath. A pore of the porous ceramic sintered body 114 of the present invention, i.e. a narrow path along which gas can communicate, is equal to or less than 10 μm, which is the same as the thickness of a sheath of high-density plasma of $10^{13}$ cm$^{-3}$. Therefore, the shower plate can be used for the high-density plasma of $10^{13}$ cm$^{-3}$.

TABLE 1

| $T_e$ = 2 eV, $V_0$ = 12 V | | |
|---|---|---|
| Plasma Density (cm$^{-3}$) | Debye Length (mm) | Sheath Thickness (mm) |
| $10^{13}$ | 0.003 | 0.01 |
| $10^{12}$ | 0.011 | 0.04 |
| $10^{11}$ | 0.033 | 0.13 |
| $10^{10}$ | 0.105 | 0.41 |

Next, a method of introducing plasma excitation gas into a processing chamber will now be described with reference to FIG. 1. The plasma excitation gas is introduced via the gas inlet port 110, into the vertical holes 105 via the gas supply hole 111 and the spaces 112, and is exhausted from the porous ceramic sintered body 114 sintered and bonded with the leading end of the vertical holes 105 to the processing chamber 102.

A slot plate 116 of a radial line slot antenna in which a plurality of slits are opened to irradiate microwaves, a wavelength shortening plate 117 for propagating microwaves in a diameter direction, and a coaxial waveguide plate 118 for introducing microwaves into the radial line slot antenna are disposed on the upper surface of the cover plate 108 covering the upper surface of the shower plate 106. The wavelength shortening plate 117 is inserted between the slot plate 116 and a metal plate 119. A cooling flow path 120 is formed in the metal plate 119.

In the above construction, the plasma excitation gas supplied from the shower plate 106 is ionized by microwaves irradiated from the slot plate 116, so that high-density plasma is generated in a region of several mm directly below the shower plate 106. The high-density plasma spreads and reaches the substrate 103 to be processed. In addition to the plasma excitation gas, oxygen gas or ammonia gas may be introduced from the shower plate 106 as gas for actively generating radicals.

A lower shower plate 121 formed of a conductor, such as aluminum or stainless steel, is disposed between the shower plate 106 and the substrate 103 to be processed in the processing chamber 102 of the plasma processing apparatus. The lower shower plate 121 includes a plurality of gas-communicating paths 121a for introducing process gas supplied via a process gas supply port 122 to the substrate 103 to be processed in the processing chamber 102. The process gas is exhausted to the space between the lower shower plate 121 and the substrate 103 to be processed, through a plurality of nozzles 121b formed in a surface of the gas-communicating paths 121a corresponding to the substrate 103 to be processed. With regard to a plasma-enhanced chemical vapor deposition (PECVD) process, when a silicon thin film is formed, silane gas or disilane gas is introduced as the process gas, and when a low dielectric film is formed, $C_5F_8$ gas is introduced as the process gas. A CVD process using organic metal gas as the process gas is possible. With regard to a reactive ion etching (RIE) process, $C_5F_8$ gas or the oxygen gas is introduced as the process gas for silicone oxide film etching, and chlorine gas or HBr gas is introduced as the process gas for metal film or silicone etching. When etching requires ion energy, RF power is applied by connecting an RF power source 123 to an electrode installed in the holding stage 104 through a capacitor, thereby generating a self bias voltage onto the substrate 103 to be processed. The type of process gas to be supplied is not limited thereto, and the process gas to be supplied and its pressure are set depending on a process.

A plurality of openings 121c are formed between the adjacent gas-communicating paths 121a of the lower shower plate 121 so that plasma excited by microwaves in the upper part of the lower shower plate 121 diffuses to pass through into spaces between the substrate 103 to be processed and the lower shower plate 121 in an efficient manner.

Heat flows that flow into the shower plate 106 due to exposure to the high density plasma are exhausted by a refrigerant such as water flowing along the cooling flow path 120 via the slot plate 116, the wavelength shortening plate 117, and the metal plate 119.

The shower plate 106 is used for the plasma processing apparatus having the above construction, so that the porous ceramic sintered body 114 sintered and bonded with the vertical hole 105 does not become detached from the vertical hole while the shower plate 106 is being used, and the reverse flow of plasma to a gas inlet side can be more completely prevented. Thus, an abnormal discharge or deposition of plasma in the shower plate 106 is prevented, thereby preventing deterioration of transmission efficiency of microwaves for exciting plasma or deterioration of yield.

As a result of uniformly supplying the plasma excitation gas to the substrate 103 to be processed and supplying the process gas through the nozzles 121b from the lower shower plate 121 to the substrate 103 to be processed, the process gas uniformly flows from the nozzles 121b formed in the lower shower plate 121 to the substrate 103 to be processed, so that a component of the process gas which returns to the upper part of the shower plate 106 is reduced. As a result, decomposition of process gas molecules according to an excessive dissociation due to exposure to the high density plasma is reduced, and even if the process gas is deposition gas, deterioration of microwaves transmitting efficiency caused by the deposition of the process gas to the shower plate 106 is difficult to occur, which reduces a cleaning time and increases process stability and reproducibility, thereby increasing productivity and realizing high quality substrate processing.

Figure 4:
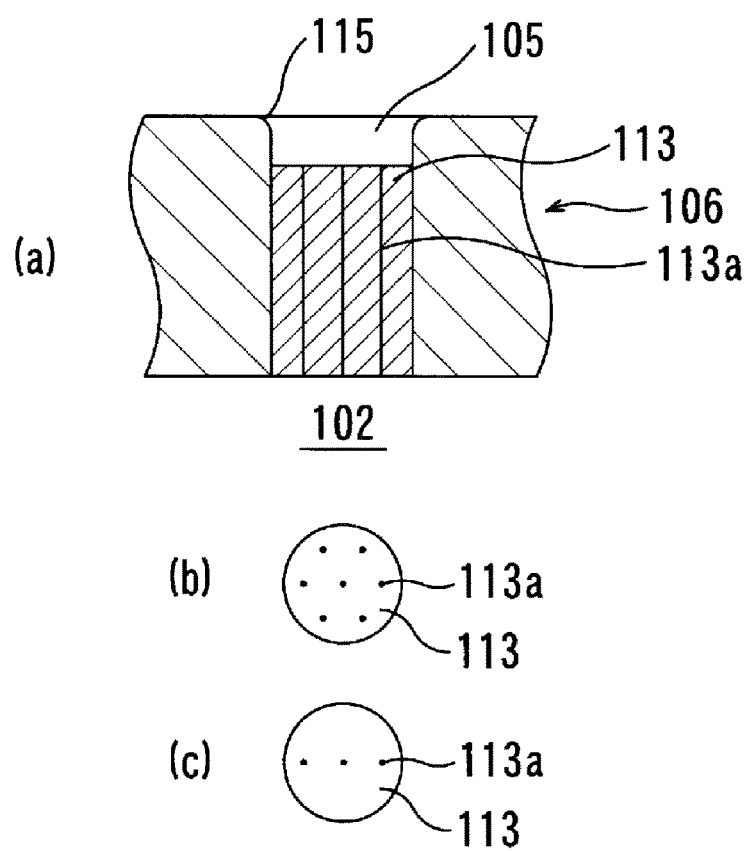
FIG. 4 is views of another structure of the vertical hole of the shower plate shown in FIG. 1.

FIGS. 4(a) through 4(c) are views of another structure of the vertical hole 105. FIG. 4(a) is a cross-sectional view of the vertical hole 105. FIGS. 4(b) and 4(c) are bottom plan views of the vertical hole 105. A ceramic member 113 is sintered and bonded with the vertical hole 105. The ceramic member 113 is formed of alumina ceramic and has an outer diameter of 3.0 mm and a full length of 8 mm. A plurality of gas release holes 113a each having a diameter of 0.05 mm and a length of 8 mm are formed in the ceramic member 113. That is, an aspect ratio (length/hole diameter) of each gas release hole 113a is 8/0.05=160. The number of the gas release holes 113a is not particularly limited. Although 7 gas release holes 113a and 3 gas release holes 113a are respectively shown in FIGS. 4(b) and 4(c), a gas release speed may be reduced by possibly using a larger number of gas release holes 113a. When the diameter of the gas release holes 113a is reduced to 0.05 mm, the outer diameter of the ceramic member 113 may be reduced to about 1 mm.

Also, the length of the gas release holes 113a may be longer than the mean free path of electrons, that is, the average distance electrons travel without collision. Table 2 shows the mean free path of electrons. The mean free path is in adverse proportional to a pressure, and is 4 mm at the pressure of 0.1 Torr. Since the gas inlet side of the gas release holes 113a is actually under high pressure, Since the mean free path is shorter than 4 mm due to high pressure in the gas inlet side of the gas release holes 113a, the length of the gas release holes 113a of the present invention is 8 mm, which is longer than the mean free path.

TABLE 2

Mean free path of electrons in the atmosphere of Ar gas

| Pressure (P) (Torr) | Mean Free Path ($\lambda$en) (mm) |
|---|---|
| 10 | 0.04 |
| 1 | 0.4 |
| 0.1 | 4 |

$\lambda$en (mm) = 0.4/P (Torr)

Also, with regard to the vertical hole 105 shown in FIGS. 4(a) through 4(c), chamfer processing 115 is performed on a corner portion of the gas inlet side of the vertical hole 105 in order to prevent self-generation of plasma by igniting the plasma excitation gas due to a concentrated microwave electric field. The chamfer processing 115 may be C chamfer processing, preferably R chamfer processing. R chamfer processing may be performed after the C chamfer processing is performed in order to achieve the chamfer processing 115.

Referring to FIGS. 4(a) through 4(c), the shower plate 106 sintered and bonded with the ceramic member 113 can be manufactured by using the same methods as described in the manufacturing examples 1 and 2. Another manufacturing example is described below.

(Manufacturing Example 3)

With respect to a ceramic member, a mixing body, obtained by adding a cellulose injection molding binder of 4% and an adequate amount of water to $Al_2O_3$ powder having an average powder particle diameter of 0.6 μm and a purity of 99.99%, is prepared, and an injection molding body is obtained from an injection metal mold in which 24 pins of 80 μm are installed in mold nozzle having an inner diameter of 16 mm.

After drying the injection molding body, the dried body and a debinded body which is processed at a temperature of 450° C. are sintered at a temperature of 150° C. As a result, the dried body and the debinded body form a ceramic member having an outer diameter of 1.0 mm and including gas release holes each having a hole diameter of 50 μm, thus, the contraction rate from the mold dimensions is proved to be 37.5%.

Meanwhile, the exact same green body for the shower plate as described in the manufacturing example 1 is prepared, except that a molding pressure of sprayed granulated powder is set to be 147 MPa, and three types of molding bodies including the vertical holes respectively having inner diameters of 1.16 mm, 1.135 mm, and 1.19 mm are manufactured.

Since the sintering contraction rate of the green body for the shower plate is 16.2%, the molding bodies include the vertical holes having inner diameters of 0.972 mm, 0.951 mm, and 0.997 mm, respectively. The ceramic member having the outer diameter of 1.0 mm and including the gas release holes each having the hole diameter of 50 μm is fitted into the vertical holes of the green body for the shower plate and is simultaneously sintered, so that a stress of tightening the ceramic member with the inner diameters of the vertical holes cause differences of 0.028 mm, 0.049 mm, and 0.003 mm, respectively, between the diameter dimensions.

The differences between the diameter dimensions caused by the tightening stress are 0.049 mm (about 50 μm), 0.028 mm (about 30 μm), and 0.003 mm (3 μm). When the differences between the diameter dimensions are about 50 μm and 30 μm, it might be expected that the ceramic member is compressed and thus destroyed or the vertical holes are pressed and thus cracks occur in the vertical holes. However, the ceramic member is not destroyed or cracks do not occur in the vertical holes and the differences between the diameter dimensions are estimated to have been absorbed by a slight thermal plasticity therebetween at a high temperature during the simultaneous sintering and by a sliding phenomenon of crystalline grain boundaries.

Also, since surfaces joined between the inner surface of the vertical holes and the outer surface of the ceramic member are sintered and integrally bonded, although a gap of about 2 μm partially exists, the shower plate having a uniform crystal structure in which gaps may act as communication paths for the plasma excitation gas do not exist, and crystalline particles continuously exist over a joining boundary without forming the joining boundary.

(Manufacturing Example 4)

Instead of the ceramic member sintered at 1500° C., a ceramic member pre-sintered at 1100° C. is used. The pre-sintered ceramic member is fitted into a green body for a shower plate that is molded to have an outer diameter of 1.15 mm and a vertical hole having an inner diameter of 1.19 mm, and is simultaneously sintered. The present manufacturing example 4 has the same effect as the manufacturing example 3.

(Manufacturing Example 5)

The injection molding body of the ceramic member used in the manufacturing example 3 has a large sintering contraction rate, and thus the outer diameter dimension of the injection molding body is greater than the inner diameter dimension of the vertical holes that are molded in the green body for the shower plate. Thus, the injection molding body cannot be fitted into the vertical hole.

However, if 2% of the injection molding binder used in the manufacturing example 3 is mixed with 0.5% of a deflocculant, it is possible to reduce a moisture content of a mixing body. Also, although the sintering contraction rate of the ceramic member manufactured at a plunger injection molding pressure of 1.5 ton/cm$^2$ is 28% with regard to the mold dimension, a dried body having an outer diameter dimension of 1.15 mm is obtained by contracting the metal molding dimension by 10% when drying the injection molding body. In more detail, the sintering contraction rate of the dried body is 18%, less than the sintering contraction rate of 19% of the green body for the shower plate molded, which is achieved by using 78 MPa in the manufacturing example 1. Thus, although it is possible and natural to fit the ceramic member into the vertical hole of the green body for the shower plate and simultaneously sinter the ceramic member fitted into the vertical hole in the step of the injection molding body (powder molding body) before being baked, it is also possible to fit a debinded body of the injection molding body (powder molding body), a pre-sintered body thereof, and a sintered body thereof into the vertical holes of the green body for the shower plate and simultaneously sinter the bodies fitted into the vertical holes.

In more detail, as described above, by measuring the sintering contraction rates of various molding pressures of the shower plate and the sintering contraction rates of various mixing bodies of the ceramic member or at every molding pressure, it is possible to fit the injection molding body (powder molding body) of the ceramic member, a debinded body of the injection molding body, a pre-sintered body of the injection molding body, or a sintered body of the injection molding body into the vertical hole of the green body of the shower plate, a debinded body of the green body, or a pre-sintered body of the green body, and simultaneously sinter the body fitted into the vertical hole, thereby obtaining the shower plate, having no gap, that is sintered and bonded integrally with the ceramic member and the vertical hole of the shower plate.

An integral sintered body without a gap is also obtained by fitting the ceramic member sintered at a high temperature of 1500° C. into the vertical hole of the shower plate pre-sintered to have a relative density of 96% and simultaneously sintering the ceramic body fitted into the vertical hole in a HIP processing device at a temperature of 1400° C. and a pressure of 1500 kg/cm$^2$.

Although the high purity alumina ceramic material is used in the manufacturing examples 1 through 5, if a low dielectric loss ceramic material has a dielectric loss in the range of $5 \times 10^{-3}$ and $1 \times 10^{-5}$, a small amount of a grain growth inhibition agent, an alumina ceramic material mixed with $Y_2O_3$ and mullite, a material formed of $Al_2O_3$ and $Y_2O_3$, or a material containing a garnet component that is a compound of $Al_2O_3$ and $Y_2O_3$, and further a ceramic material such as AlN, $SiO_2$, mullite, $Si_3N_4$, or SiAlON, can be used.

A combination of the ceramic material for the shower plate and the ceramic material for gas release hole members (the porous ceramic sintered body and ceramic member) is not particularly limited but the material component of the ceramic materials may be the same.

In addition, when the gas release hole members are fitted (inserted) into vertical holes and are integrally sintered, it is possible to attain the same function and effect as an adhesive agent by coating the outer surface of the gas release hole members with fine powder of same material component, thereby obtaining the same result as obtained in the previous manufacturing examples.

Figure 5:
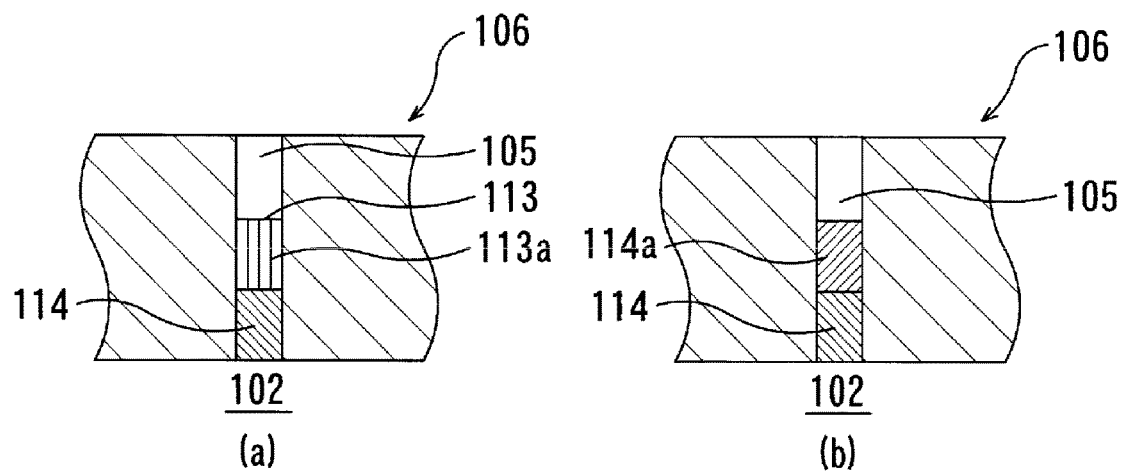
FIG. 5 is views of another structure of the vertical hole of the shower plate shown in FIG. 1.

FIGS. 5(a) and 5(b) are views of another structure of the vertical hole 105.

Referring to FIG. 5(a), as a double security measure for preventing the reverse flow of plasma, the ceramic member 113 is additionally disposed in the gas inlet side of the porous gas ceramic sintered body 114, and the ceramic member 113 and the porous gas ceramic sintered body 114 are sintered and bonded with the vertical hole 105 of the shower plate 106. Referring to FIG. 5(b), a porous ceramic sintered body 114a is additionally disposed in the gas inlet side of the porous gas ceramic sintering body 114, and the porous ceramic sintered body 114a and the porous gas ceramic sintered body 114 are sintered and bonded with the vertical hole 105 of the shower plate 106. In this case, in order to reduce a pressure loss of plasma excitation gas, the porous ceramic sintered body 114a disposed in the gas inlet side has greater porosity and a greater pore diameter than the porous gas ceramic sintered body 114 on a gas release side (for example, average pore diameter: 10~30 μm, porosity: 50~70%).

The number, diameter, and length of the vertical holes 105, and the number, diameter, and length of gas release holes 113a in the ceramic member 113 are not limited to the numerical values described in the present embodiment.

[Embodiment 2]

Figure 6:
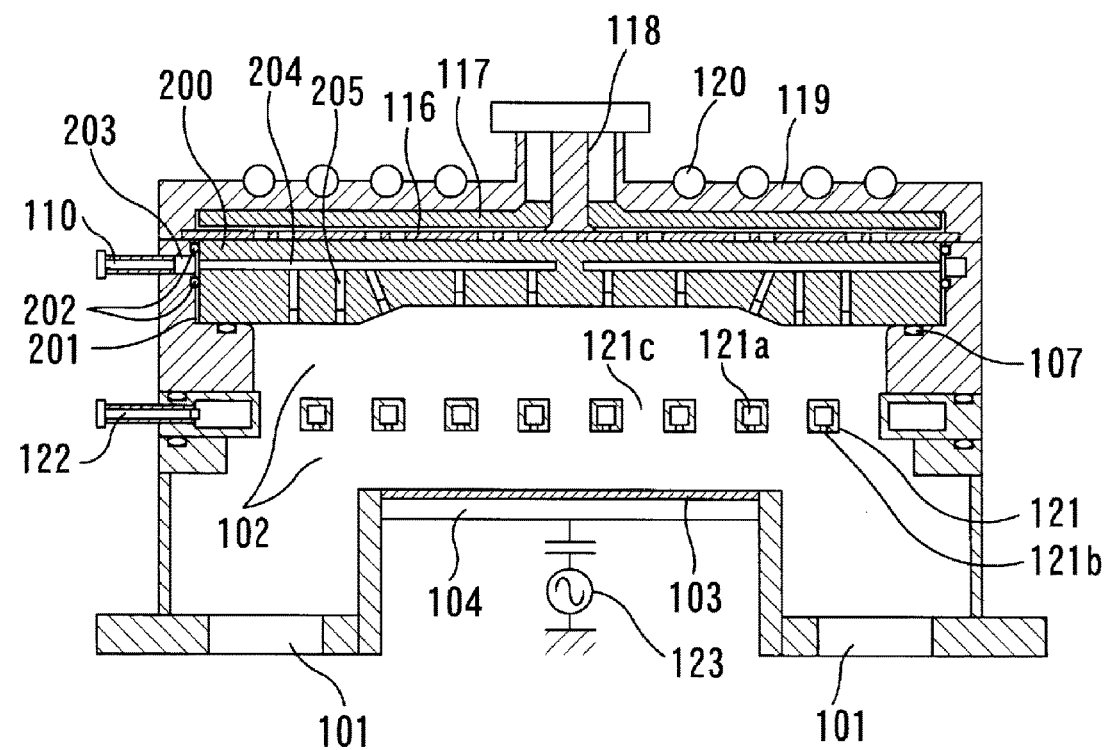
FIG. 6 is a cross-sectional view of a microwave plasma processing apparatus according to another embodiment of the present invention.

FIG. 6 is a cross-sectional view of a microwave plasma processing apparatus according to another embodiment of the present invention. Like reference numerals in the previous embodiment with reference to FIGS. 1 through 5 denote like elements.

In the present embodiment, a shower plate 200 is attached to an upper portion of the processing chamber 102 through the sealing O-ring 107 at a position corresponding to the substrate 103 to be processed on the holding stage 104, as a part of the outer walls of the processing chamber 102. The shower plate 200 is formed of dielectric alumina having a relative permittivity of 9.8, and a low microwave dielectric loss (equal to or less than $9 \times 10^{-4}$). Also, two sealing O-rings 202 and a ring-shaped space 203 surrounded by the side surface of the shower plate 200 are formed at a position corresponding to the side surface of the shower plate 200 on a wall surface 201 of the processing chamber 102. The ring shaped space 203 communicates with the gas inlet port 110 for introducing plasma excitation gas.

Meanwhile, a plurality of horizontal holes 204 each having a diameter of 1 mm in a horizontal direction are formed in the side surface of the shower plate 200 and are opened in a center direction of the shower plate 200. At the same time, a plurality (230) of vertical holes 205 communicate with the processing chamber 102 so as to communicate with the horizontal holes 204.

Figure 7:
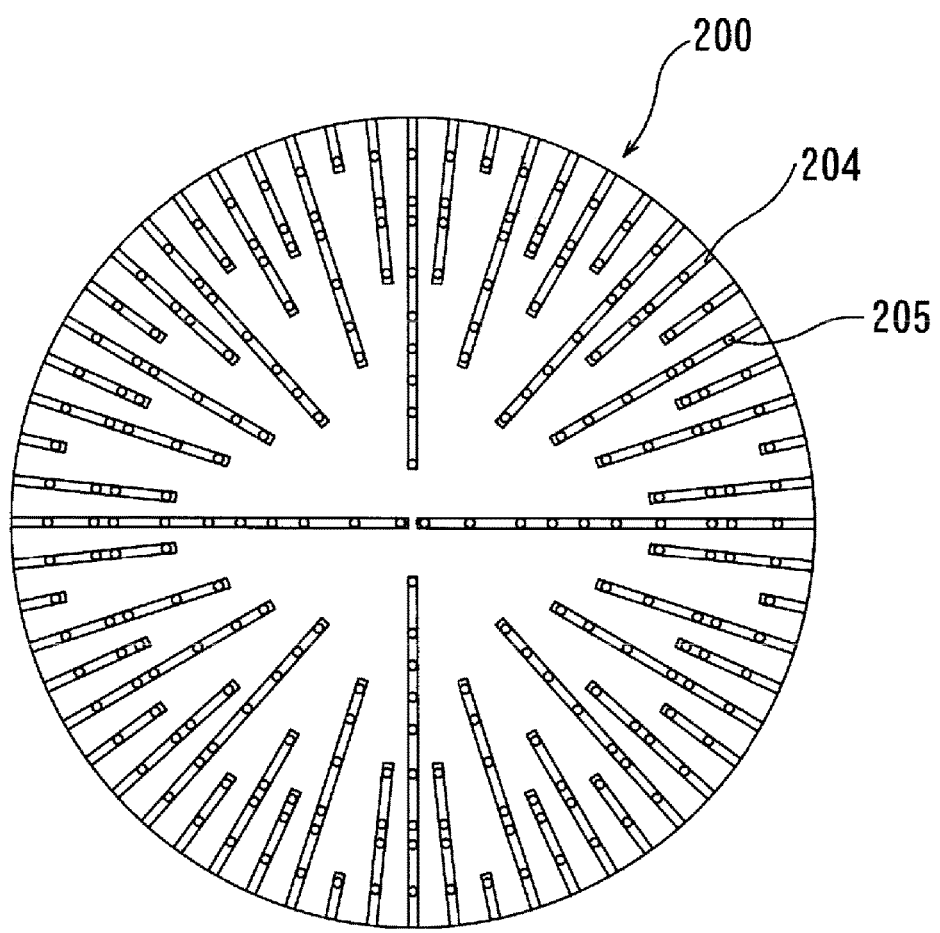
FIG. 7 is a top plan view of the arrangement of horizontal holes and vertical holes of a shower plate shown in FIG. 6.
Figure 8:
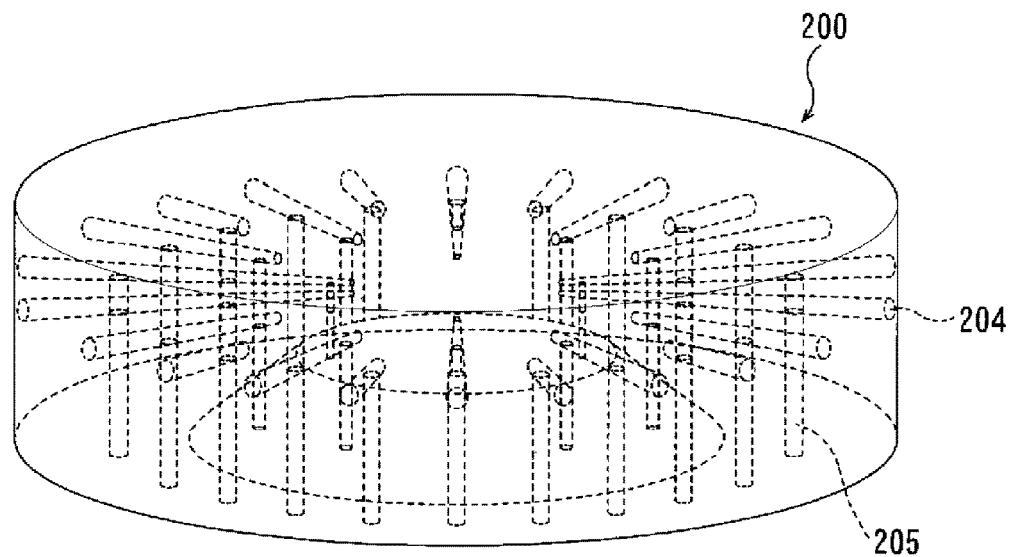
FIG. 8 is a schematic perspective view of the arrangement of the shower plate and a cover plate shown in FIG. 6.
Figure 9:
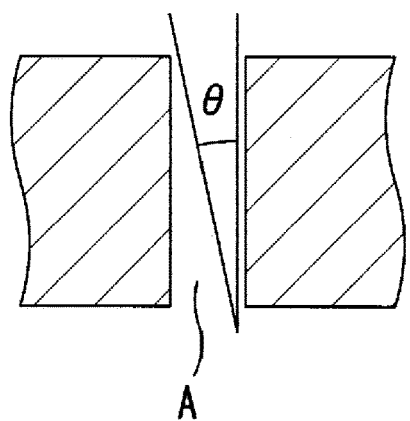
FIG. 9 is a view for explaining the relationship between an aspect ratio of gas release holes and the reverse flow of plasma.
Figure 10:
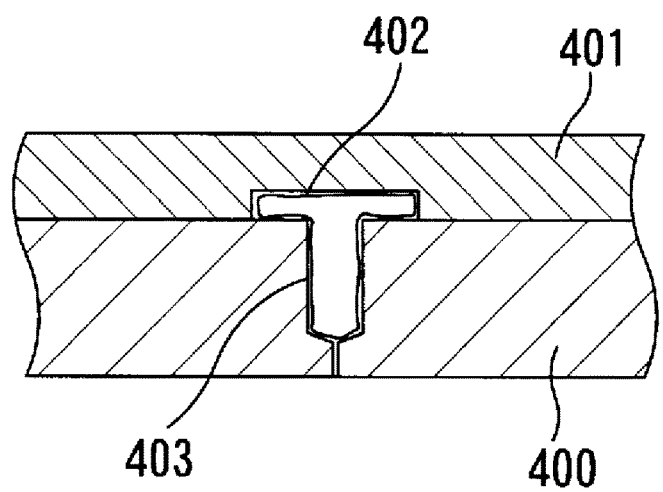
FIG. 10 is a cross-sectional view of a conventional shower plate.

FIG. 7 is a top plan view of the arrangement of the horizontal holes 204 and the vertical holes 205 of the shower plate 200. FIG. 8 is a schematic perspective view of the arrangement of the horizontal holes 204 and the vertical holes 205 of the shower plate 200.

The shower plate 200 of the present embodiment can be formed by sintering and bonding a ceramic member or a porous gas-communicating body into the vertical holes 205 in the same manner as described in the previous embodiment.

INDUSTRIAL APPLICABILITY

The shower plate of the present invention can be used for various plasma processing apparatuses, such as parallel-plate type high frequency excitation plasma processing apparatuses, induction-coupled type plasma processing apparatuses, in addition to a microwave plasma processing apparatus.

What is claimed is:

1. A method of manufacturing a shower plate which is to be disposed in a plasma processing apparatus and to discharge a plasma excitation gas so as to generate plasma in the plasma processing apparatus, the method comprising:
   providing a first ceramic member having a plurality of vertical holes, wherein the plurality of vertical holes are to be release paths for the plasma excitation gas;
   fitting each of a plurality of second ceramic members and each of a plurality of porous gas-communicating bodies into each of the vertical holes, wherein each of the second ceramic members has a plurality of gas release holes and each of the porous gas-communicating bodies has pores which communicate in a gas-communicating direction; and
   sintering the first ceramic member, and the second ceramic members and the porous gas-communicating bodies which are fitted into the vertical holes of the first ceramic member.

2. The method of claim 1, wherein the first ceramic member is a green body formed by molding material powder of a shower plate and by processing the vertical holes, a debinded body of the green body, or a pre-sintered body of the green body, and
   the each of the second ceramic members is:
   a powder molding body processed in a predetermined shape by molding material powder of a shower plate, a debinded body of the powder molding body, a pre-sintered body of the powder molding body or a sintered body of the powder molding body, and/or
   a powder molding body processed in a predetermined shape by molding material powder of a porous gas-communicating body, a debinded body of the powder molding body, a pre-sintered body of the powder molding body or a sintered body of the powder molding body.

3. The method of claim 2, wherein an aspect ratio of length to hole diameter of each of the gas release holes is equal to or greater than 20.

4. The method of claim 3, wherein each of the gas release holes has a diameter of 20 μm to 70 μm.

5. The method of claim 2, wherein each of the gas release holes has a diameter of 20 μm to 70 μm.

6. The method of claim 1, wherein an aspect ratio of length to hole diameter of each of the gas release holes is equal to or greater than 20.

7. The method of claim 6, wherein each of the gas release holes has a diameter of 20 μm to 70 μm.

8. The method of claim 1, wherein each of the gas release holes has a diameter of 20 μm to 70 μm.

9. A method of manufacturing a shower plate which is to be disposed in a plasma processing apparatus and to discharge a plasma excitation gas so as to generate plasma in the plasma processing apparatus, the method comprising:
   providing a first ceramic member having a plurality of vertical holes, wherein the plurality of vertical holes are to be release paths for the plasma excitation gas;
   fitting each of a plurality of first porous gas-communicating bodies and each of a plurality of second porous gas-communicating bodies into each of the vertical holes, wherein each of the first porous gas-communicating bodies and each of the second porous gas-communicating bodies have pores which communicate in a gas-communicating direction, and average pore diameter and porosity of the first porous gas-communicating bodies are different to average pore diameter and porosity of the second porous gas-communicating bodies; and
   sintering the first ceramic member, and the first porous gas-communicating bodies and the second porous gas-communicating bodies which are fitted into the vertical holes of the first ceramic member.

10. The method of claim 9, wherein the first ceramic member is a green body formed by molding material powder of a shower plate and by processing the vertical holes, a debinded body of the green body, or a pre-sintered body of the green body, and
    the each of the first porous gas-communicating bodies and the each of the second porous gas-communicating bodies are porous ceramic sintered bodies.

* * * * *